United States Patent [19]

Lin

[11] 4,051,355
[45] Sept. 27, 1977

[54] APPARATUS AND METHOD FOR INCREASING THE EFFICIENCY OF RANDOM ACCESS STORAGE

[75] Inventor: Juei-po Lin, San Diego, Calif.

[73] Assignee: NCR Corporation, Dayton, Ohio

[21] Appl. No.: 681,675

[22] Filed: Apr. 29, 1976

[51] Int. Cl.² ............................................. G11C 29/00
[52] U.S. Cl. ........................... 235/302.3; 340/173 BB; 340/174 ED
[58] Field of Search ......... 235/153 AM; 340/173 BB, 340/174 ED

[56] References Cited

PUBLICATIONS

Creamer; M. K. et al., Controlled Retry on Storage Errors, In IBM Tech. Disc. Bull. 11(9): pp. 1100–1101, Feb. 1969.

Primary Examiner—R. Stephen Dildine, Jr.
Attorney, Agent, or Firm—J. T. Cavender; James H. Phillips; Edward Dugas

[57] ABSTRACT

Apparatus and method are described wherein the average access time utilized for recovering stored data in a random access storage system is reduced. An access cycle is begun with the predetermined typical data bit delivery time known and with the knowledge of the worst case data bit delivery time. An output buffer is connected to a random access storage for receiving the data bits of an output message from the storage. The output buffer is gated to receive the data from the random access storage; the gate signal enables the output buffer to receive data bits over a predetermined time interval. The output buffer is connected to a data transmission means such as a bus, and is gated by a second signal to place the stored information on the bus. The second signal, the message gate signal, is timed to place the information stored in the output buffer on the bus during the period beginning with the typical data bit delivery time and ending after the worst case data bit delivery time. Thus, the data bits may be received from the random access storage and subsequently or immediately transmitted by the output buffer depending on the time of arrival of the data bit at the output buffer. Parity checking means check the parity of the message being transmitted from the random access storage to the output buffer; at the end of the time allowed for the worst case data bit delivery time the condition of the parity check means is ascertained, and if an incorrect parity condition exists an error/retry signal is generated to begin a retry cycle to again transmit the contents of the output buffer to the bus.

9 Claims, 4 Drawing Figures

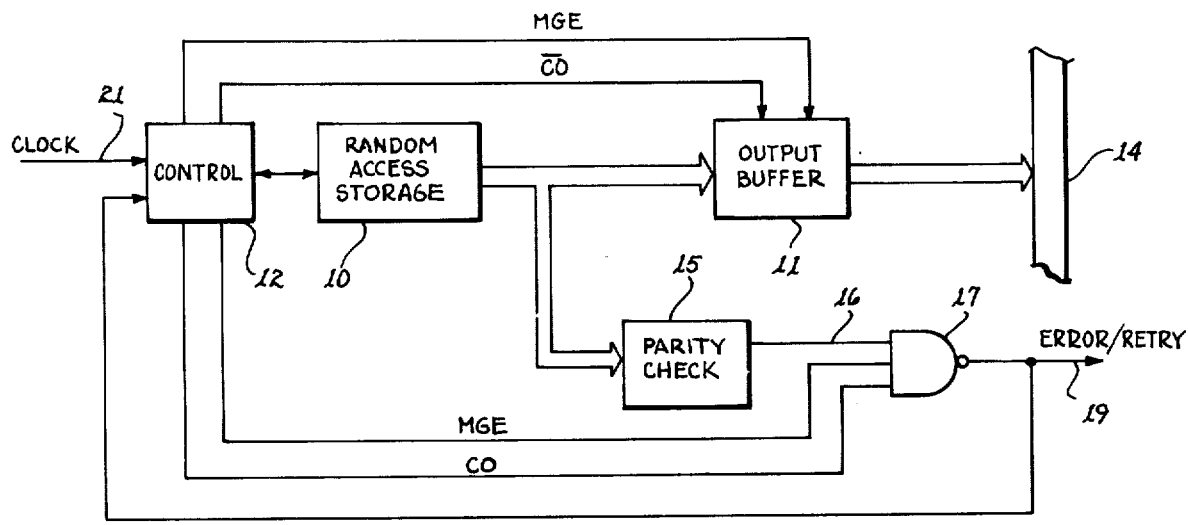
fig. 1
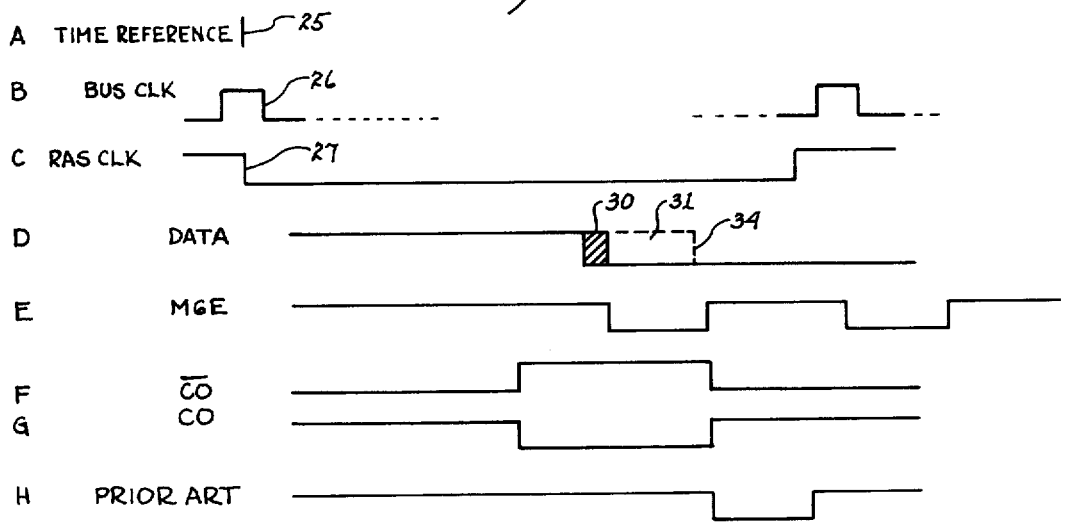
fig. 2
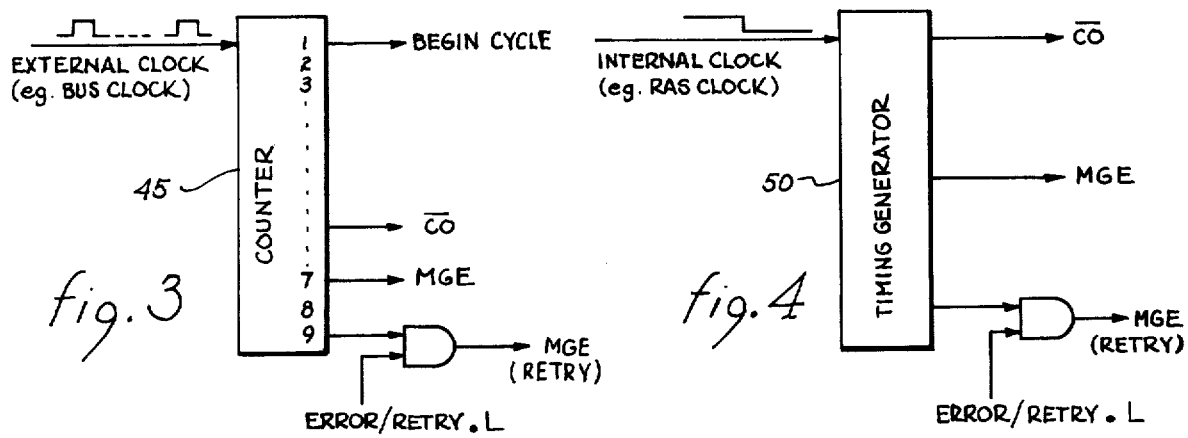
fig. 3
fig. 4

APPARATUS AND METHOD FOR INCREASING THE EFFICIENCY OF RANDOM ACCESS STORAGE

The present invention relates to random access storage systems and methods, and more particularly to apparatus and a method for decreasing the average access time to a random access storage system.

Random access storage is a fundamental and key element in every data processing system. The speed with which information stored in the system can be retrieved is a fundamental parameter which will dictate the overall speed of the system and therefore its capacity and capability.

Random access storage systems may be constructed from a variety of presently available elements implementing various electronic/physical techniques. Present memory devices such as those incorporating MOS technology have been found to be most satisfactory for present day computer technology. Regardless of the type of storage or technique of storage, the time required to address the storage and retrieve the addressed information is a critical feature of the system. Normally, the data message that is retrieved from the system is read out of the memory in parallel and temporarily stored in a register or buffer prior to the message being retransmitted to a requesting subsystem of the data processing system. The speed with which the information can be retransmitted from the output buffer or register depends on the time required for the information to be placed in the buffer from the memory. Since the message comprises a plurality of data bits, prior art accessing techniques require that the output buffer not retransmit the stored information until a sufficient time has elapsed to insure that all of the data bits being transmitted from the random access storage have been received. The time required to insure that all such data has been received will depend on the speed of the respective storage elements within the random access storage. Since the storage system will incorporate an array of storage elements each of which may slightly differ in its speed of response, it has been the practice in the prior art to delay the retransmission of the information in the output buffer for a time corresponding to the worst case data bit delivery time that can be expected from the random access storage. That is, if the storage comprises an array of storage elements and it can be shown that of the number of elements present in the array there is a reasonable possibility of one of the elements having a response time slower than the remaining elements, then the delay imposed on the output buffer will be that delay necessary to accommodate the one slowest element of the array.

It may therefore be seen that the average access time of the random access storage system is determined, in the prior art, by the response time expected from the slowest of the elements in the memory array. Attempting to shorten the time for gating the output buffer to retransmit the data stored therein has heretofore resulted in substantial delays and attempts to reaccess the storage system as a result of late-arriving bits delivered to the output buffer from the storage. In these prior arts systems, if a data bit of a message being read from the random access storage arrives at the output buffer after the predetermined maximum time (which as stated above is the worst case condition) and the message stored in the output buffer is retransmitted and the parity is checked, the parity check will indicate a parity error and the storage system is then reaccessed thus requiring an entirely separate and repeated memory access cycle.

It is therefore an object of the present invention to provide a method and apparatus for decreasing the average access time in a random access storage system.

It is another object of the present invention to provide a method and apparatus for transmitting information retrieved from a random access storage system in accordance with the timing relying upon the typical data bit delivery time of the random access storage device.

It is still another object of the present invention to provide a method and apparatus for reducing the average access time to a random access storage system by gating an output buffer of the system to retransmit information obtained from the storage device in a shorter period of time than would be expected using a worst case delivery time as the basis for retransmission.

It is yet another object of the present invention to provide a method and apparatus for reducing the average access time in a random access storage system by checking the parity of messages transmitted from the storage device to an output buffer and generating a retry signal in the event of non-parity.

These and other objects of the present invention will become apparent to those skilled in the art as the description thereof proceeds.

Briefly, in accordance with one embodiment chosen for illustration, the present invention contemplates the utilization of a standard or typical random access storage device such as those presently used throughout the data processing industry. Such devices require an output buffer to receive the parallel data bits being retrieved therefrom for temporary storage prior to retransmission to a requesting subsystem of the data processing system. A parity checking circuit detects non-parity conditions in the message being transmitted from the device to the output buffer. The output buffer is clocked to enable it to receive and load the data bits being derived from the storage device for retransmission. The clocking of the output buffer occurs prior to the typical data bit delivery time of the device to insure that the data bits are loaded in the output buffer as soon as they are sent by the storage device. A second gating signal, the data gate signal, is applied to the output buffer to gate the contents thereof out of the buffer for transmission by any suitable means, such as a data bus, to the requesting sub-system. The data gate applied to the output buffer is timed to occur shortly after the typical data bit delivery time of the device but before the worst case data bit delivery time of the device. In this manner, all data bits that have been received by the output buffer in the usual or typical time are immediately retransmitted on a data bus; those bits that may arrive late but nevertheless arrive before the worst case limit are immediately retransmitted from the output buffer without awaiting for a separate gate or clock signal. When the data gate signal is applied to the output buffer, the status of the parity check is interrogated to determine if the message being sent by the output buffer includes "good" parity. In the event of an error, an error/retry signal is generated which will reapply the data gate signal to the output buffer to again retransmit the data contained in the buffer. The present invention may more readily be described by reference to the accompanying drawings in which:

FIG. 1 is a schematic block diagram showing the method and apparatus of the present invention.

FIG. 2 is a timing diagram showing various signal levels and useful in explaining the operation of the apparatus and method of the present invention.

FIG. 3 is a schematic block diagram showing one means for generating timing signals useful in the system of Fig. 1.

FIG. 4 is a schematic block diagram showing another means for generating timing signals for use in the system of FIG. 1.

Referring now to FIG. 1, the apparatus of the present invention includes a random access storage 10 which may be a typical random access memory device used for storing data in the form of binary or binary-coded bits. The technique of random storage and the arrangement utilized for retrieving the stored information are sufficiently well known to those skilled in the art to negate any detailed discussion here. When a random access storage device such as that shown at 10 in FIG. 1 is accessed at a particular address, the information stored at that address is usually transferred therefrom in bit parallel form to a register or output buffer such as that shown at 11. The output buffer 11 receives and stores the data bits; typically, the buffer 11 is "gated" by a clock signal that enables information being sent by the storage device 10 to be placed in the buffer. In the system chosen for illustration the output buffer clock signal $\overline{CO}$ is shown being applied to the buffer 11 from a storage controller 12. Thus, when the signal in $\overline{CO}$ is applied to the buffer 11, the buffer is enabled and may thereafter receive data bits from the storage device 10 for temporary storage and retransmission to a requesting sub-system through a data transmission means such as a data bus 14. The data bits, in addition to being supplied to the buffer 11, are also applied to a parity-check network 15 which investigates the parity of the message being transmitted to the buffer 11. A non-parity condition will result in a low signal occurring on the line 16 applied to a gate 17.

The contents of the output buffer 11 are gated to the data bus 14 through the expediency of the application of a data gate signal MGE also derived from the control 12. Thus, the output buffer 11 is first clocked by an appropriate level of the output buffer clock signal $\overline{CO}$ to permit the receipt of data bits from the storage device 10 and the temporary storage of the data bits in the buffer 11. The contents of the buffer 11 are subsequently gated out to the data bus 14 through the application of the proper signal level of the data gate signal MGE to the buffer. The signal level of the data gate signal MGE, as well as the complement of the output buffer clock signal $\overline{CO}$ (that is, CO), are also applied to the gate 17. A low signal level of MGE, CO and the output of the parity check network 15 on the line 16 will result in an error/retry signal level occurring on the line 19. This signal level will then be transmitted to the requesting subsystem to indicate that the contents of the output buffer 11 being transmitted to the subsystem through the data bus 14 is in error and that a "retry" will be made to again read the contents of the output buffer. The error/retry level on the line 19 will also be transmitted back to the control 12 to permit a reread of the output buffer 11.

The control 12 is shown in FIG. 1 as receiving a clock signal input at 21 which clock may be derived from an external or an internal source. When the system of the present invention is to be utilized with a data processing system having an available or mandatory clock system the clock applied to the control 12 may be conveniently the system clock. When the system incorporates a data bus such as that shown at 14, and the data bus incorporates a mandatory clocking system, the clock applied to the control 12 may be the bus clock. Alternatively, in a totally asynchronous system the internal clock of the storage device 10 may be utilized to provide the necessary timing to the control 12 to thereby provide the various timing and gating signals as will be described more fully hereinafter.

Referring to FIG. 2, timing information is shown that may be useful in describing the method and apparatus of the present invention. It will be recalled that the sequence of events is instigated at a particular point in time by a clock pulse applied to the control 12 of FIG. 1. For convenience, we may consider a point in time as a reference point from which to time the various events of the system of the present invention. In FIG. 2, the time reference 25 may occur as a result of a clock pulse 26 applied from an external clock source or may result simply by the triggering of a random access storage clock 27 resulting from the instigation of a memory access cycle. For convenience, it will be assumed that the system being described operates in accordance with a mandatory data bus clock and that the bus clock 26 starts the time of events in the system of the present invention.

When the memory access cycle has begun, data is supplied by the storage device to the output buffer. The data being delivered from the storage device arrives at the output buffer at varying times depending on the specific storage element from which the data bit is received. As shown in FIG. 2-D the data would normally arrive at the output buffer at a typical data bit delivery time 30; the variation of this typical data bit delivery time about a nominal value is shown in FIG. 2-D as the shaded portion indicting that most of the data bits will be received within a very predictable range. As mentioned previously, a very small percentage of the storage elements of a random access storage will have performance characteristics falling below the desired standards. These specific elements may cause a data bit to be stored therein to be read out or delivered by the storage device to the output buffer after a time that is substantially greater than the typical data bit delivery time. The portion of the wave form of FIG. 2-D shown in broken lines 31 represents the time frame within which the late data bits may be expected to be received from the storage device. It may be seen, that a worst case data bit delivery time indicated at 34 repesents the greatest delay that can be tolerated in the receipt of data bits from the storage device.

The output buffer such as buffer 11 shown in FIG. 1 is gated by a signal level to enable it to receive and temporarily store the data bits being delivered thereto from the storage device 10. This signal level is shown in FIG. 2 as the output buffer clock signal level $\overline{CO}$ which is applied to the buffer at a time substantially prior to the typical data bit delivery time. To insure that all of the data bits were captured by the output buffer including those data bits that arrived late and including the worst case data bit delivery times, the prior art has gated the output buffer to continuously accept the data bits; however, after the worst case data bit delivery time had passed, the prior art then gated the output buffer with a data gate signal level to transmit the contents of the output buffer to the requesting subsystem. The timing of this prior art data gate signal level is shown in FIG. 2-H. It may therefore be seen that the timing cycle of the random access storage system required that the access time include a sufficient delay in the retransmission of the data stored in the output buffer to capture the data bits arriving at the worst case data bit delivery time. The system was thus bound by the restraint dictated by the worst case data bit delivery time even though such worst case delivery times were very rare and even though the overwhelming preponderance of data bits were being received by the output buffer substantially before the worst case data bit delivery time and generally during the typical data bit delivery time. In contrast, the present invention provides a data gate signal level MGE as shown in FIG. 2-E that is applied to the output buffer to gate the contents thereof out of the buffer to be transmitted on the data bus 14. The data gate signal level MGE gates the contents of the output buffer at the end of the typical data bit delivery time and continues to gate the output buffer for a time extending beyond the worst case data bit delivery time. Thus, since the output buffer clock signal level $\overline{CO}$ and the data gate signal level MGE simultaneously occur during a period of time extending from the end of a typical data bit delivery time to a worst data bit delivery time, data bits received by the output buffer from the access storage device during that time are not only loaded into the output buffer but are immediately made available to the data bus 14 or any other device or subsystem designated to receive the data bits from the storage system. Therefore, the access time of the storage system is reduced by the clocking of the output buffer at a time substantially prior to that dictated by the prior art.

In the event a data bit arrives from the storage device after the data gate signal MGE is applied delivery time, and the data bit in that position of the message being transmitted is incorrect, a parity check will indicate a parity error. As shown in FIG. 1, the parity check network 15 will lower the level of the output signal therefrom on the line 16 and apply that level to the gate 17. The data gate signal level MGE is also applied to the gate 17 as is the complement of the output buffer clock signal level CO (Fig. 2-G). When these three signal levels become low, an error/retry signal is produced and is made available to the subsystem receiving the message from the output buffer 11 to indicate that the message thus received incorporates an error. This signal also instigates a "retry" cycle which will again clock the contents of the output buffer to the data bus 14. Since the system chosen for illustration assumes an external clock from a data bus, the retry or retransmitting the contents of the buffer may occur on the next bus clock. Thus, rather than instigate an entirely new storage access cycle, the retry signal developed as a result of the parity check, the application of the data gate signal level, and the output buffer clock signal complement simply provides the regeneration of the data gate signal level MGE to again clock the output buffer and retransmit the contents thereof over the data bus 14.

While the method and apparatus of the present invention may be incorporated in random access storage systems utilizing a variety of clocking schemes to achieve the desired timing a particular clock arrangement will now be given. The bus clock pulses of figure 2-B have a period of 56 nanoseconds; the particular system under consideration places a time restraint on the random access storage system such that data should be available at the beginning of the 7th clock period or at 392 nanoseconds. The elements of the storage device should provide the respective data bits well within this time period and the typical data bit delivery time as indicated in FIG. 2-D should permit the clocking of the output buffer with the data signal level MGE. Therefore, the leading edge of the data gate signal level MGE will occur at the 7th clock of the system. This signal level will be maintained for one clock period of 56 nanoseconds during which time the contents of the output buffer are made available for transmission over the data bus.

The output buffer clock signal level $\overline{CO}$ is generated sufficiently in advance of the beginning of the 7th clock to enable the output buffer to capture data bits arriving from the storage device; the leading edge of the output buffer clock signal level $\overline{CO}$ is thus positioned approximately 100 nanoseconds prior to the 7th clock. When the data gate signal MGE is applied (that is, when it generates activity in the output buffer) and the output buffer clock signal level $\overline{CO}$ is high (CO is low), the gate 17 is enabled to provide the above mentioned indication of any parity error that may exist. Thus, if a parity error existed at the time the buffer was being clocked out to the data bus, the error/retry signal would occur and a retry effort would be made. The retry effort however need not be a complete new access cycle; rather, the data gate signal level MGE applied to the output buffer need only be regenerated at the next available clock. In the system chosen for illustration, the next available clock (allowing for the inherent time delays in the various circuit elements) is in the 9th clock.

The significance of the time savings of the method and apparatus of the present invention may be gleaned from a review of the timing in the system chosen for illustration. The utilization of a data gate signal level occurring at the typical data bit delivery time rather than the worst case data bit delivery time results in the savings of one clock period in every eight clock periods. This time saving occurs for every access made to the storage system. Further, if an error occurs and a retry or reaccess can cure the error, the present apparatus and method provides a retry within one additional clock period rather than requiring a complete reaccess cycle represented by eight additional clock periods.

The clocking system used as the source of timing control to apply the various signal levels in the apparatus and method of the present invention is not critical. As mentioned previously, the schematic block diagram of FIG. 1 indicates an external clock being applied to the control 12; FIGS. 3 and 4 respectively indicate, in somewhat greater detail, the schematic representation of the application of an external clock or an internal clock to generate the appropriate signal level timing. Referring to FIG. 3, the external clock signal, which may be the bus clock as described above, is applied to a counter 45 which simply counts up one upon the receipt of each successive external clock. The first clock may generate a "begin cycle" signal to be utilized in the random access storage device to trigger the access cycle. The output buffer clock signal level $\overline{CO}$ is subsequently generated at a time sufficiently before the typical data bit delivery time to ensure the capture of data bits being delivered by the storage device to the output buffer.

The timing of this output buffer clock signal level is not critical and may occur, in the system described above using the seventh clock period as the time within which data is typically available, at approximately the fifth clock pulse. Assuming the constraints applied to the random access storage system as described above, it will therefore be assumed that the data temporarily stored in the output buffer must be made available to the data bus at the seventh clock. Accordingly, a counter 45 simply provides a suitable data gate signal level MGE upon the receipt of the seventh external clock pulse. When the ninth clock pulse is received by the counter, a signal level is applied to a gate 46 which also receives the signal level of the error/retry output from the gate 17 of FIG. 1. Therefore, if the error/retry level is high, and the ninth clock pulse results in a high output from a counter 45 applied to the gate 46, a data gate signal level MGE (retry) will be generated and applied to the output buffer to again gate the contents thereof to the data bus. The timing system shown in FIG. 4 produces the identical signal levels as the system of FIG. 3. However, the instigation of the timing sequence is provided an internal clock source such as a random access storage device internal clock. The application of the appropriate clock level to the timing generator 50 results in the subsequent timing and generation of the signal levels $\overline{CO}$, MGE, and MGE (retry). The timing generator 50 may take any of a variety of well known forms and may, for example, incorporate its own free running clock that is simply triggered by the application of the random access storage clock thereto. Other timing systems may be utilized in addition to those shown in FIGS. 3 and 4 to provide a means for generating the respective signal levels; the specific technique utilized for the generation of such signals is not important to the concept of the present invention.

It may therefore be seen that the apparatus and method of the present invention provide a means for significantly reducing the average access time in a random access storage system. The reduction in access time is achieved through the gating of an output buffer at that time which will result in the transmission of data bits received not only after a typical data bit delivery time but also at any time before a worst case data bit delivery time. Nevertheless, the triggering or gating of the output buffer without waiting for the receipt of the last to be expected data bits (the worst case data bit delivery time) reduces the time necessary to access the storage device and receive the requested data. Further, the generation of a retry signal upon the occurrence of a parity error permits the contents of the data buffer to be retransmitted without the necessity of an additional complete storage access cycle. The latter time savings can be significant; the total time savings afforded by the apparatus and method of the present invention is also enhanced by the fact that the number of storage elements in a random access storage device that provide the stored data bits after the worst case data bit delivery time is so small as to be almost insignificant and the retry afforded by the present invention effectively eliminates the errors caused by those elements.

What is claimed is:

1. An improved method for receiving a message, having data bits therein, from a random access storage and transmitting said message, said data bits having a typical data bit delivery time and a worst case data bit delivery time, comprising the steps of:
   a. storing said data bits in a buffer as they are received from a random access storage;
   b. simultaneously transmitting said data bits from said buffer for a predetermined period of time ending after said worst case data bit delivery time;
   c. checking the parity of said message as the data bits therein are stored in said buffer;
   d. generating an error signal, when message is being transmitted to the bus and non-parity occurs.

2. The method of claim 1 including the additional step of: retransmitting said data bits from said buffer after said error signal has been generated.

3. An improved method for receiving a message having data bits therein from a random access storage and transmitting said message, said data bits having a typical data bit delivery time and a worst case data bit delivery time, comprising the steps of:
   a. storing said data bits in a buffer as they are received from a random access storage;
   b. simultaneously transmitting said data bits from said buffer for a predetermined period of time beginning at said typical data bit delivery time and ending after said worst case data bit delivery time;
   c. checking the parity of said message as the data bits therein are stored in said buffer;
   d. generating an error signal, when message is being transmitted to the bus and non-parity occurs.

4. Method set forth in claim 3 including the additional step of retransmitting said data bits after said error signal has been generated.

5. In a random access storage system including a random access storage device for storing data messages comprising a plurality of data bits said system having a typical data bit delivery time and a worst case data bit delivery time, apparatus for decreasing the average access time of said system comprising:
   a. a data bus for transmitting data;
   b. an output buffer connected to said random access storage device responsive to an output buffer clock signal level for receiving and temporarily storing data bits from said device, and connected to said data bus and responsive to a data gate signal level for transmitting temporarily stored data to said bus;
   c. parity check means connected to said random access storage device for checking parity of messages delivered to said output buffer from said random access storage device and for generating a non-parity signal when message parity is incorrect;
   d. timing means connected to said output buffer for generating an output buffer clock signal level beginning before said typical data bit delivery time to enable said output buffer to receive and temporarily store said data bits and for generating a data gate signal level beginning at said typical data bit delivery time and ending after said worst case data bit delivery time to enable said output buffer to transmit temporarily stored data to said data bus.

6. The apparatus set forth in claim 5 wherein said output buffer clock signal ends at the same time as said data gate signal level.

7. The apparatus set forth in claim 5 including means responsive to the existence of said non-parity signal when message is being transmitted for generating an error/retry signal.

8. The apparatus set forth in claim 7 wherein said output buffer clock signal ends at the same time as said data gate signal level.

9. The apparatus set forth in claim 7 including means responsive to said error/retry signal for generating a second data gate signal level to retransmit the data bits stored in said output buffer.

* * * * *